United States Patent
Choi et al.

(10) Patent No.: US 8,010,765 B2
(45) Date of Patent: Aug. 30, 2011

(54) SEMICONDUCTOR MEMORY DEVICE AND METHOD FOR CONTROLLING CLOCK LATENCY ACCORDING TO REORDERING OF BURST DATA

(75) Inventors: Joo-Sun Choi, Gyeonggi-do (KR); Won-Chang Jung, Gyeonggi-do (KR); Hi-Choon Lee, Gyeonggi-do (KR); Sung-Min Yim, Gyeonggi-do (KR); Chul-Woo Park, Gyeonggi-do (KR); Won-Il Bae, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 951 days.

(21) Appl. No.: 11/775,780

(22) Filed: Jul. 10, 2007

(65) Prior Publication Data

US 2008/0052482 A1    Feb. 28, 2008

(30) Foreign Application Priority Data

Jul. 14, 2006  (KR) .................. 10-2006-0066198

(51) Int. Cl.
*G06F 12/00* (2006.01)
(52) U.S. Cl. .................. 711/167; 711/103; 711/E12.001
(58) Field of Classification Search .................. 711/167, 711/168, 105, 103, E12.001
See application file for complete search history.

(56) References Cited

U.S. PATENT DOCUMENTS

| | | | |
|---|---|---|---|
| 6,842,391 B2 * | 1/2005 | Fujioka et al. | 365/219 |
| 7,343,388 B1 * | 3/2008 | Burney et al. | 708/209 |
| 2003/0099243 A1 * | 5/2003 | Oh et al. | 370/395.21 |
| 2008/0072115 A1 * | 3/2008 | Cho et al. | 714/751 |

FOREIGN PATENT DOCUMENTS

| | | |
|---|---|---|
| KR | 2002-0014563 | 2/2002 |
| KR | 10-0422954 | 3/2004 |
| KR | 2005-0101034 | 10/2005 |

OTHER PUBLICATIONS

Jun Shao et al, "A Burst Scheduling Access Reordering Mechanism", High Performance Computer Architecture (HPCA), IEEE 13th International Symposium on Digital Object Identifier, 2007 , pp. 285-294.*
Jun Pang et al, "A Priority-Expression-Based Burst Scheduling of Memory Reordering Access", Embedded Computer Systems: Architectures, Modeling, and Simulation, International Conference on Digital Object Identifier, 2008 , pp. 203-209.*
English language abstract of Korean Publication No. 2002-0014563.
English language abstract of Korean Publication No. 10-0422954.
English language abstract of Korean Publication No. 2005-0101034.

* cited by examiner

*Primary Examiner* — Pierre-Michel Bataille
(74) *Attorney, Agent, or Firm* — Muir Patent Consulting, PLLC

(57) ABSTRACT

In an embodiment, a semiconductor memory device includes a clock latency that can be controlled responsive to whether or not an output order of burst data is reordered. The semiconductor memory device may comprise a control unit and a latency control unit. The control unit may generate a latency control signal having a logic level that varies depending on whether or not an output order of burst data is reordered. The latency control unit may control a latency value in response to the latency control signal. The semiconductor memory device and the method of controlling the latency value responsive to a reordering of the burst data allow for an optimally fast memory access time.

16 Claims, 6 Drawing Sheets

SEMICONDUCTOR MEMORY DEVICE AND METHOD FOR CONTROLLING CLOCK LATENCY ACCORDING TO REORDERING OF BURST DATA

CROSS-REFERENCE TO RELATED PATENT APPLICATIONS

This application claims the priority of Korean Patent Application No. 10-2006-0066198, filed on Jul. 14, 2006, in the Korean Intellectual Property Office, the disclosure of which is incorporated herein in its entirety by reference.

BACKGROUND OF THE INVENTION

1. Field of the Invention

The present invention relates to a semiconductor memory device, and more particularly, to a semiconductor memory device and method for controlling clock latency according to reordering of burst data.

2. Description of the Related Art

Semiconductor memory devices generally support a burst mode data transfer. In the burst mode, data corresponding to the read command are synchronized with a clock signal and are continuously and consecutively output. The burst data may be a plurality of data corresponding to column addresses that correspond to the read command and have a predetermined number of different least significant bits.

The number of continuously output data, for example, may be 4 or 8. In other words, in the burst mode, when a column address is input, column addresses corresponding to the rest of the data, that is, 3 or 7 units of data are automatically generated. This leads to the advantage that each data unit, such as a bit or byte, does not need its own addressing. Instead, only the first unit of data may have an address and then following consecutive data units are assumed to have the following consecutive addresses. The burst data are output in a fixed order.

FIGS. 1A and 1B are timing diagrams of burst data output from a semiconductor memory device. Referring to FIGS. 1A and 1B, the burst data are output in the order of "D1", "D2", "D3", and "D4", and "D3", "D4", "D1", and "D2", respectively. The semiconductor memory device stored the data in a memory cell array in the output order of the burst data shown.

However, a user may require a different output order of burst data than that output from the memory device. In order words, the user may prefer to reorder the burst data to be different than the order that it is output from the memory device.

However, reordering the burst data increasing the access time of the memory device.

SUMMARY OF THE INVENTION

Embodiments of the present invention provide a semiconductor memory device that supports a burst mode, the semiconductor memory device comprising a control unit to generate a latency control signal responsive to whether an output order of burst data is reordered, and a latency control unit to control a latency value responsive to the latency control signal. The latency value may be the number of clock pulses that elapse before the first data of the burst data is output from a memory cell array from when a read command is applied to the semiconductor memory device. The latency control signal may be generated by using upper bits of a row address of the semiconductor memory device. The latency value may be greater when the output order of the burst data is reordered than when the output order of the burst data is not reordered.

In one embodiment the latency value is "4" when the output order of the burst data is reordered, and is "3" when the output order of the burst data is not reordered. The latency control signal may be a logic 'high' when the output order of the burst data is reordered.

The control unit may receive information about the reordering of the burst data from a user.

The latency control unit may set the latency value to a default value when the output order of the burst data is not reordered.

In another embodiment, the semiconductor memory device may comprise a burst data output unit that outputs the burst data responsive to the latency value.

In still another embodiment, the semiconductor memory device may comprise a latency fix unit that generates a fixed latency value regardless of whether or not the burst data is reordered.

In still another embodiment, the semiconductor memory device may comprise a selection unit that chooses one of the latency value controlled by the latency control unit and the fixed latency value.

In still another embodiment, the semiconductor memory device may comprise a mode register set (MRS) that determines whether to control the latency value using information about changes in latency that is input from the outside.

In another aspect of the present invention, a method of controlling a latency value in a semiconductor memory device that supports burst mode comprises generating a latency control signal responsive to whether or not an output order of burst data is reordered, and controlling the latency value in response to the latency control signal. The latency value may be the number of clock pulses that elapse before the first data of the burst data is output from a memory cell array from when a read command is applied to the semiconductor memory device. The latency control signal may be generated using upper bits of a row address of the semiconductor memory device. The latency value may be greater when the output order of the burst data is reordered than when the output order of the burst data is not reordered.

In an embodiment, controlling the latency value may include the latency control unit setting the latency value to a default value when the output order of the burst data is not reordered.

In another aspect of the present invention, a method of controlling a latency value in a semiconductor memory device that supports burst mode comprises generating a fixed latency value regardless of whether or not an output order of burst data is reordered, and outputting the burst data according to the fixed latency value in response to a latency control signal. The latency control signal may be generated using upper bits of a row address of the semiconductor memory device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
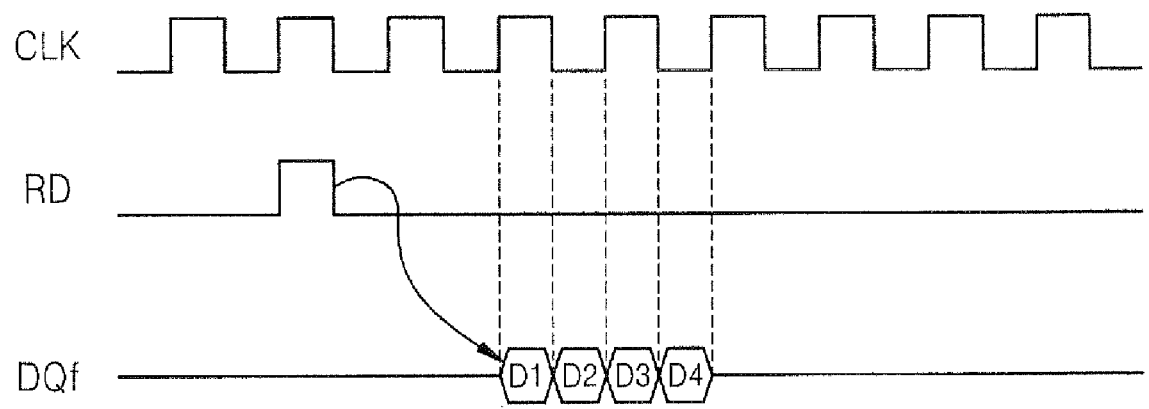
FIGS. 1A and 1B are timing diagrams of burst data output from a semiconductor memory device.
Figure 1B:
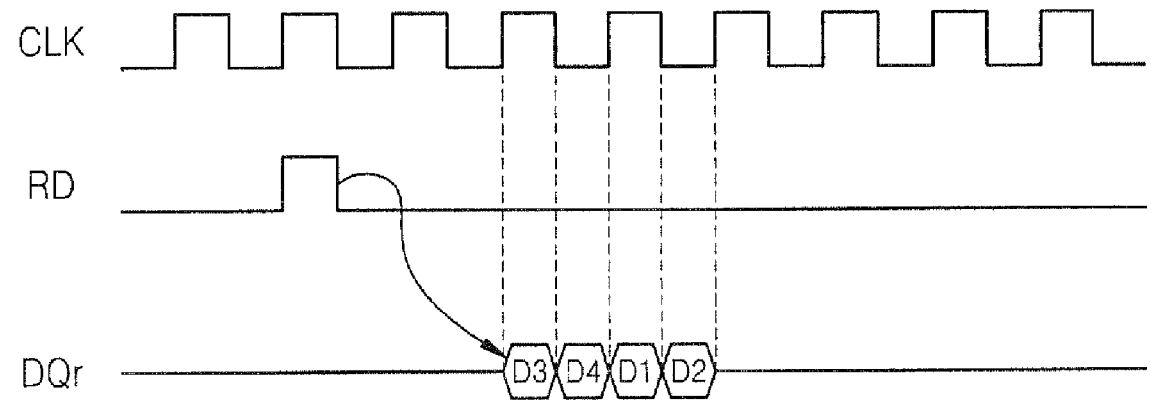
Figure 2:
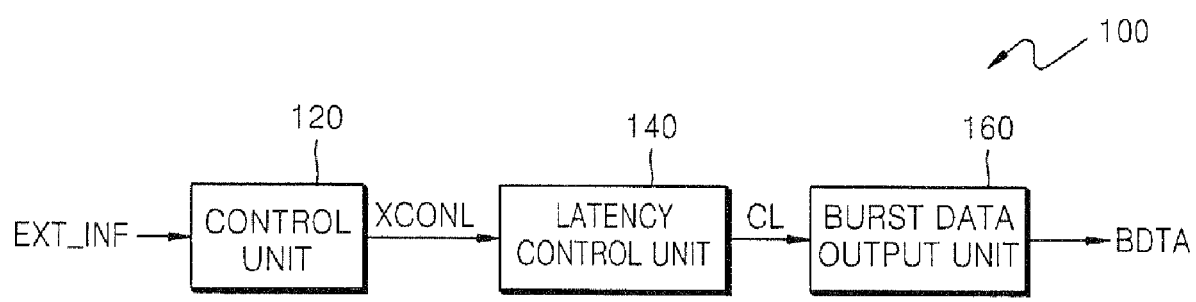
FIG. 2 is a block diagram schematically illustrating a semiconductor memory device that controls a clock latency responsive to whether or not an output order of burst data is reordered, according to an embodiment of the present invention.

FIG. 2 is a block diagram schematically illustrating a semiconductor memory device 100 that controls a clock latency according to reordering of burst data, according to an embodiment of the present invention. Referring to FIG. 2, the semiconductor memory device 100 includes a control unit 120, and a latency control unit 140. The control unit 120 is configured to generate latency control signal XCONL. The latency control signal XCONL may be generated to have logic levels that depend on whether or not an output order of the burst data BDTA is reordered. In the present embodiment, the latency control signal goes to a 'high' logic level when the burst data BDTA is reordered, but, as in another example, the latency control signal could just as easily be configured to go 'low' under the same conditions.

Reordering information of the burst data BDTA is input to the control unit 120 from the outside. In other words, a user inputs information EXT_INF to the control unit 120 about whether to reorder the burst data to be output in a changed order. The control unit 120 determines the logic level of the latency control signal XCONL using the information EXT_INF input by the user.

The latency control signal XCONL may be generated using higher order bits of a row address of the semiconductor memory device 100. In general, a semiconductor memory device recognizes an external address as a row address when a bank is activated, and recognizes the external address as a column address when a read command is input. However, since the number of row addresses is greater than the number of column addresses, in the embodiment, the two most significant bits of the row address are not used when column access occurs in response to execution of the read command. The upper bits that are not used during execution of the read command are used as a latency control signal XCONL, thereby minimizing the effort to allocate an additional control signal.

In an embodiment, the latency control signal XCONL may be applied to the semiconductor memory device 100 through a new pin (not shown) that has been added to the semiconductor memory device 100.

Still referring to the embodiment of FIG. 2, the latency control unit 140 controls a latency value CL. The latency control unit 140 operates in response to the latency control signal XCONL. The latency value CL may correspond to a number of predetermined clock pulses.

Specifically, the latency value CL may denote the number of clock pulses to elapse from when the read command is applied to the semiconductor memory device 100 to the time when the first data of the burst data BDTA is output from the memory cell array (not shown). For example, if the first data of the burst data is output after three clock pulses have lapsed from when the read command occurred, the latency value is 3.

In a preferred embodiment the latency control unit 140 sets a latency value to be higher for when the output order of the burst data BDTA is reordered than when the burst data BDTA is not reordered. This is because the access time is longer for reordered burst data BDTA. In another embodiment the latency control unit 140 may set a default latency value when the burst data BDTA is not reordered.

Still referring to the embodiment of FIG. 2, the semiconductor memory device 100 further includes a burst data output unit 160. The burst data output unit 160 outputs the burst data BDTA according to the latency value CL.

Figure 3:
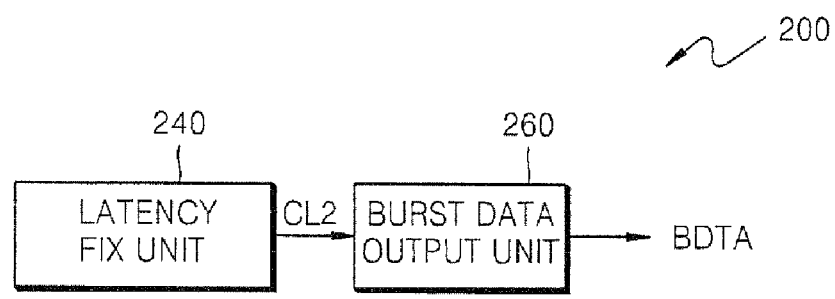
FIG. 3 is a block diagram schematically illustrating a semiconductor memory device that fixes a clock latency regardless of whether the burst data is reordered according to an embodiment of the present invention.

FIG. 3 is a block diagram schematically illustrating a semiconductor memory device 200 that sets, or fixes, a clock latency regardless of whether or not the burst data BDTA is reordered, according to another embodiment of the present invention.

Referring to FIG. 3, the semiconductor memory device 200 includes a latency fix unit 240, and a burst data output unit 260. The latency fix unit 240 is configured to generate a fixed latency value CL2 regardless of whether or not burst data BDTA is reordered. The burst data output unit 260 outputs the burst data BDTA according to the fixed latency value CL2.

The fixed latency value CL2 may be set by means of hardware of the semiconductor memory device 200. When a semiconductor memory device has a fixed latency value CL, such as the semiconductor memory device 200 illustrated in FIG. 3, the implementation of the semiconductor memory device can be simplified. Furthermore, controlling the output of the burst data BDTA can be performed using a simpler algorithm.

Figure 4:
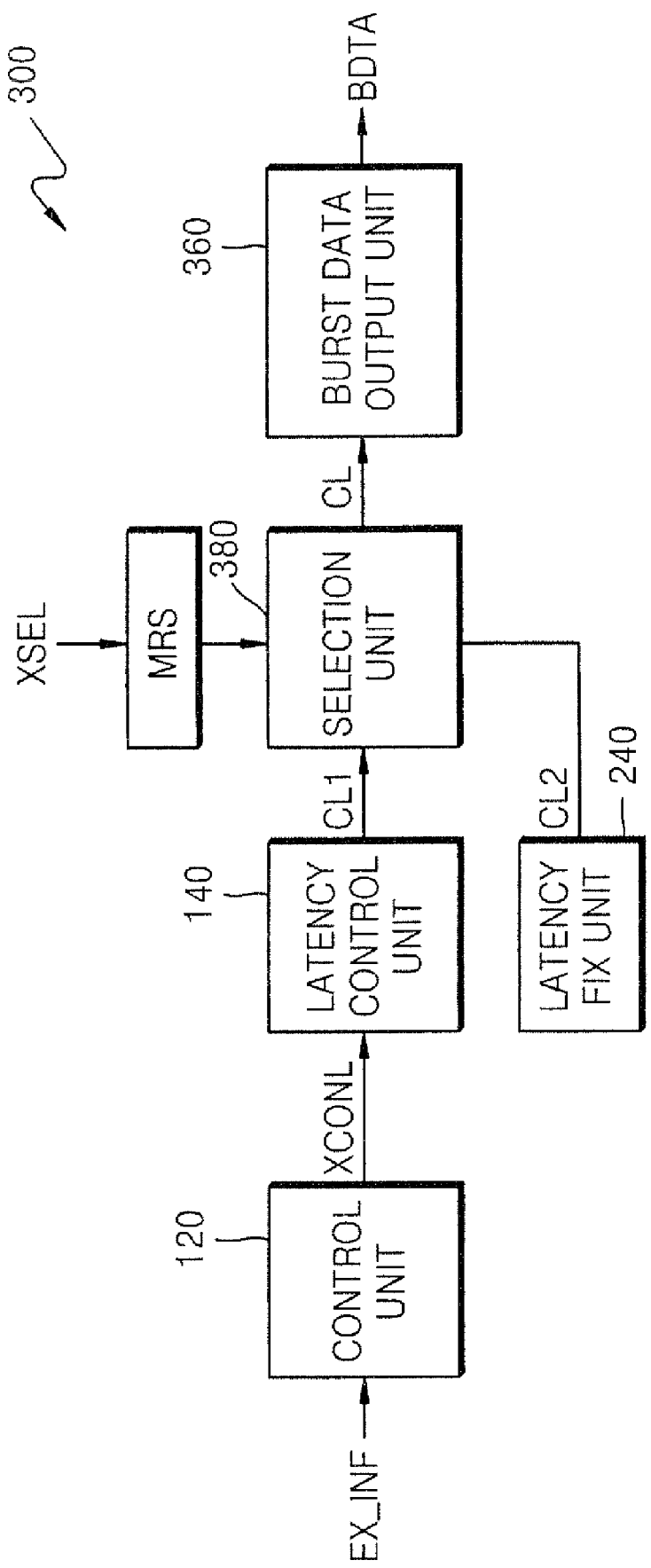
FIG. 4 is a block diagram schematically illustrating a semiconductor memory device that controls a clock latency according to a reordering of burst data, according to an embodiment of the present invention.

FIG. 4 is a block diagram schematically illustrating a semiconductor memory device 300 that controls a clock latency responsive to whether or not burst data BDTA is reordered, according to yet another embodiment of the present invention.

Referring to FIG. 4, the semiconductor memory device 300 is implemented by combining the semiconductor memory device 100 illustrated in FIG. 2 and the semiconductor memory device 200 illustrated in FIG. 3. The semiconductor memory device 300 illustrated in FIG. 4, however, further includes a selection unit 380. The selection unit 380 is configured to select either a latency value CL1 output from the latency control unit 140 or the fixed latency value CL2, and to transmit the selected latency value CL to the burst data output unit 360. The burst data output unit 360 outputs the first data of the burst data BDTA according to the input latency value CL.

Moreover, the semiconductor memory device 300 further includes a mode register set (MRS) that determines whether to control the latency value CL using external information (i.e., from the outside) XSEL regarding latency input changes. Using the semiconductor memory device 300, the user can selectively take advantage of either the semiconductor memory devices 100 or 200 illustrated in FIG. 2 and FIG. 3.

Figure 5A:
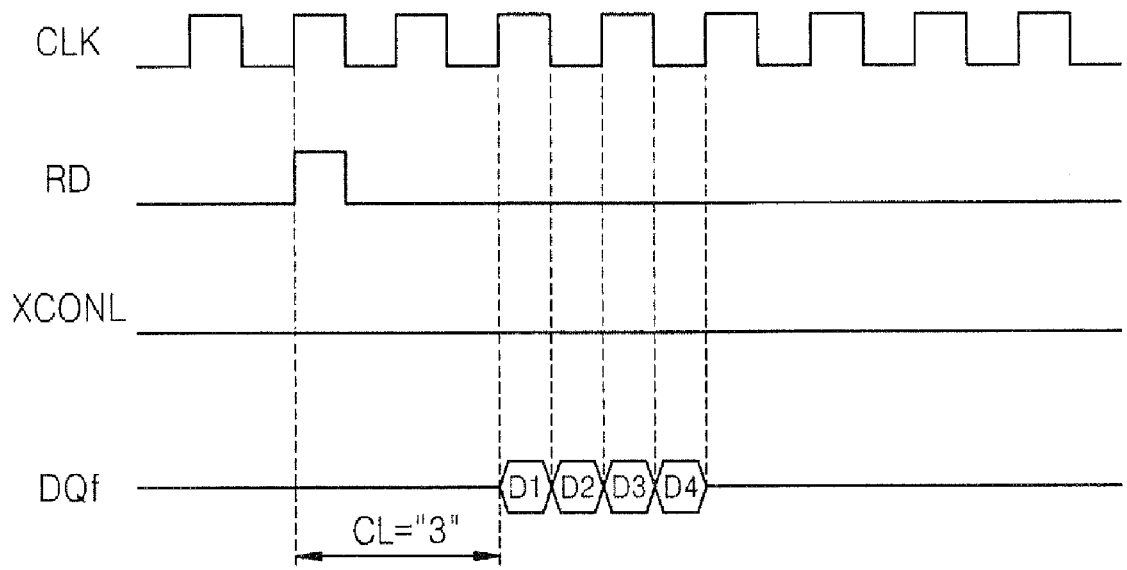
FIG. 5A is a timing diagram of burst data output from the semiconductor memory device of FIG. 2 when an output order of the burst data is not reordered.

FIG. 5A is a timing diagram showing burst data BDTA output from the semiconductor memory device 100 of FIG. 2 when the output order of the burst data is not reordered.

Referring to FIGS. 2 and 5, the burst data BDTA are output in the order of "D1", "D2", "D3", and "D4". Hereinafter, it is assumed that when the output order of the burst data BDTA is "D1", "D2", "D3" and "D4", the semiconductor memory device 100 has an optimal access time.

When the burst data BDTA is not reordered, the latency control signal XCONL goes to a logic 'low' level in the present embodiment, which causes the latency control unit 140 to set the latency value CL to "3". As a result, the burst data output unit 160 outputs the first data D1 of the burst data BDTA after three pulses of the clock signal CLK elapse from when the read command RD is applied to the semiconductor memory device 100.

Figure 5B:
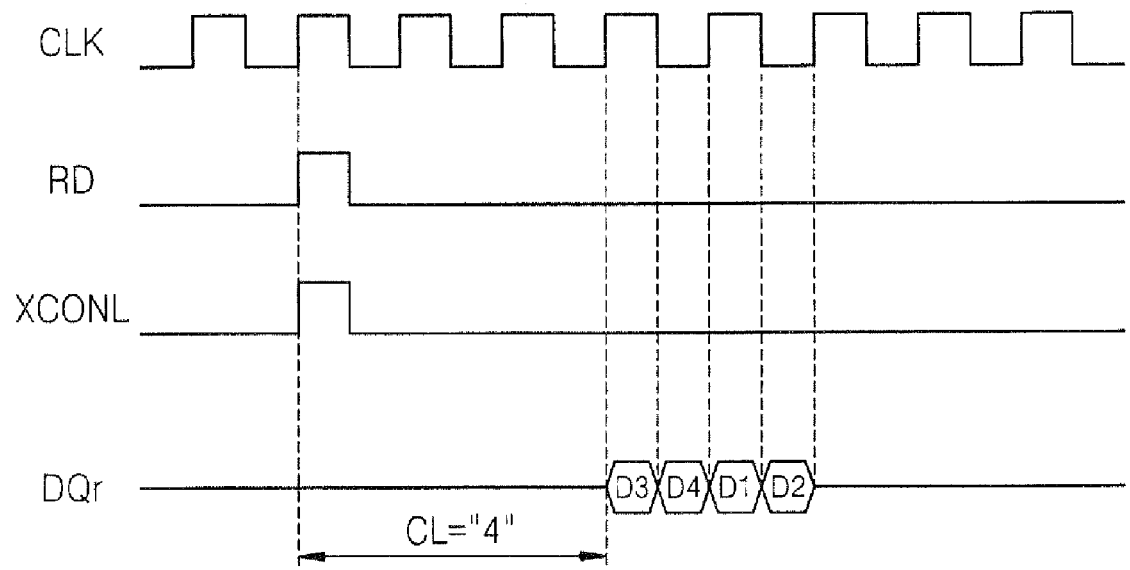
FIG. 5B is a timing diagram of burst data output from the semiconductor memory device of FIG. 2 when an output order of the burst data is reordered.

FIG. 5B is a timing diagram similar to that of FIG. 5A, but this time the output order of the burst data BDTA is reordered. Referring to FIGS. 2 and 5B, when the burst data BDTA are reordered to be output in the order "D3", "D4", "D1", and "D2", the latency control signal XCONL goes to a logic 'high' level, which causes the latency control unit 140 to set the latency value CL to "4". As a result, the burst data output unit 160 outputs the first data "D3" after four pulses of the clock signal CLK elapse from when the read command RD is applied to the semiconductor memory device 100.

As described above for the present embodiment, the semiconductor memory device 100 controls the latency value CL responsive to whether or not the burst data BDTA is reordered. This allows for practical and optimum fast access times. However, the semiconductor memory devices 200 and 300 illustrated in FIGS. 3 and 4 can also operate with a fixed latency value, according to the user's selection.

Figure 6:
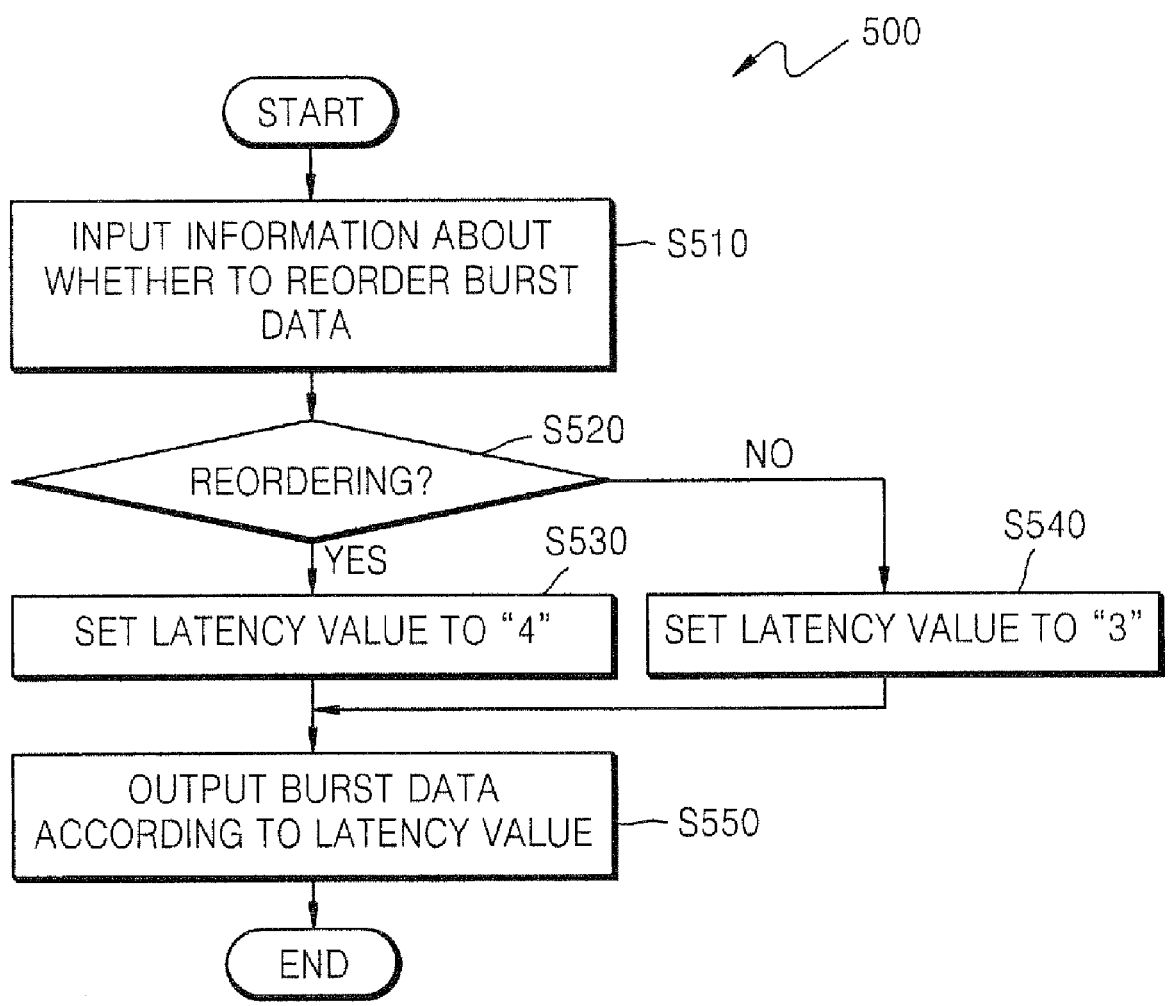
FIG. 6 is a flowchart of a method of controlling latency of a semiconductor memory device according to an embodiment of the present invention.

FIG. 6 shows a flowchart of a method 500 for controlling the latency of a semiconductor memory device according to an embodiment of the present invention. Referring to FIG. 6, the latency control method 500 is applied to a semiconductor memory device that supports a burst mode. The method includes generating a latency control signal responsive to whether or not the output order of the burst data is reordered, as in step S520. The latency value is determined in steps S530 and S540 depending on the result of step S520.

Specifically, the latency control method 500 sets the latency value to 3 when the output order of the burst data is not reordered, or sets the latency value to 4 when the output order of the burst data is reordered. This allows the semiconductor memory to output the burst data in a fast and stable fashion.

Figure 7:
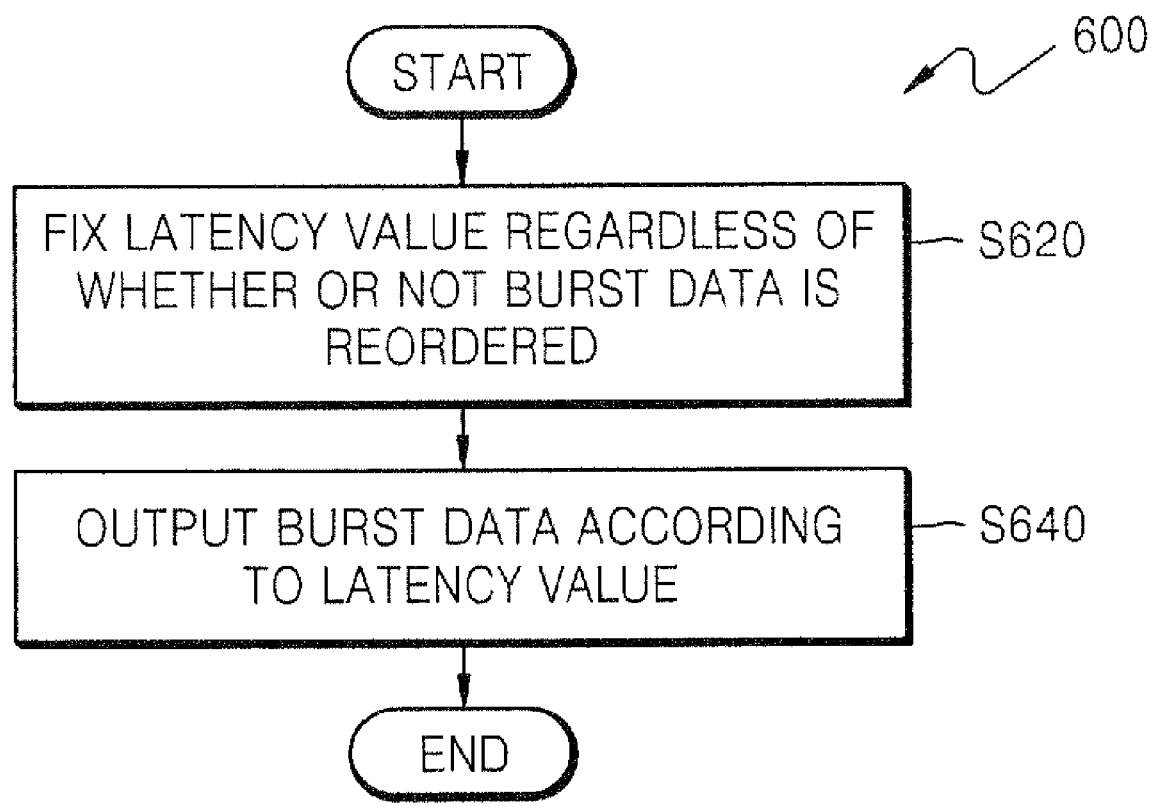
FIG. 7 is a flowchart of a method of controlling latency of a semiconductor memory device according to another embodiment of the present invention.

FIG. 7 shows a flowchart of a method 600 for controlling the latency of a semiconductor memory device according to another embodiment of the present invention. Referring to FIG. 7, the latency control method 600 is applied to a semiconductor memory device that supports a burst mode. The method includes generating a latency control signal having a fixed latency value regardless of whether or not an output order of the burst data is reordered, as in step S620. The burst data is then output according to the fixed latency value in response to the latency control signal, as in step S640.

Unlike the latency control method 500 of FIG. 6, the latency control method 600 of FIG. 7 outputs the burst data according to the fixed latency value, allowing an implementation of a simplified semiconductor memory device.

As described above, according to embodiments of the present invention, a semiconductor memory device and a latency control method for the semiconductor memory device can control a latency value responsive to whether or not an output order of burst data is reordered, thereby acquiring an optimal access time.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device that supports a burst mode, the semiconductor memory device comprising:
   a control unit to generate a latency control signal responsive to whether an output order of burst data is reordered; and
   a latency control unit to control a latency value responsive to the latency control signal,
   wherein the latency value is greater when the output order of the burst data is reordered than when the output order of the burst data is not reordered.

2. The semiconductor memory device of claim 1, wherein the latency value is the number of clock pulses that elapse before the first data of the burst data is output from a memory cell array from when a read command is applied to the semiconductor memory device.

3. The semiconductor memory device of claim 1, wherein the latency control signal is generated by using upper bits of a row address of the semiconductor memory device.

4. The semiconductor memory device of claim 1, wherein the latency value is "4" when the output order of the burst data is reordered, and is "3" when the output order of the burst data is not reordered.

5. The semiconductor memory device of claim 1, wherein the latency control signal is a logic 'high' when the output order of the burst data is reordered.

6. The semiconductor memory device of claim 1, wherein the control unit receives information about the reordering of the burst data from a user.

7. A semiconductor memory device that supports a burst mode, the semiconductor memory device comprising:
   a control unit to generate a latency control signal responsive to whether or not an output order of burst data to be output is reordered; and
   a latency control unit to control a latency value responsive to the latency control signal,
   wherein the latency control unit sets the latency value to a default value when the output order of the burst data is not reordered.

8. The semiconductor memory device of claim 1, further comprising:
   a burst data output unit that outputs the burst data responsive to the latency value.

9. The semiconductor memory device of claim 1, further comprising:
   a latency fix unit that generates a fixed latency value regardless of whether or not the burst data is reordered.

10. The semiconductor memory device of claim 9, further comprising:
    a selection unit that chooses one of the latency value controlled by the latency control unit and the fixed latency value.

11. The semiconductor memory device of claim 10, further comprising:
    a mode register set (MRS) that determines whether to control the latency value using information about changes in latency that is input from the outside.

12. A semiconductor memory device that supports a burst mode, the semiconductor memory device comprising:
    a latency control unit to control a latency value responsive to whether or not an output order of burst data is reordered;

a latency fix unit to generate a fixed latency value regardless of whether or not the output order of the burst data is reordered;

a selection unit to choose one of the latency value controlled by the latency control unit and the fixed latency value responsive to a selection signal; and a burst data output unit to output the burst data according to the chosen latency value.

13. A method of controlling a latency value in a semiconductor memory device that supports burst mode, the method comprising:

generating a latency control signal responsive to Whether or not an output order of burst data is reordered; and controlling the latency value in response to the latency control signal, wherein the latency value is greater when the output order of the burst data is reordered than when the output order of the burst data is not reordered.

14. The method of claim 13, wherein the latency value is the number of clock pulses that elapse before the first data of the burst data is output from a memory cell array from when a read command is applied to the semiconductor memory device.

15. The method of claim 13, wherein the latency control signal is generated using upper bits of a row address of the semiconductor memory device.

16. The method of claim 13, wherein controlling the latency value includes the latency control unit setting the latency value to a default value when the output order of the burst data is not reordered.

* * * * *